(12) United States Patent
Mizumura (10) Patent No.: US 12,354,828 B2
(45) Date of Patent: Jul. 8, 2025

(54) FOCUSED ION BEAM SYSTEM

(71) Applicant: V TECHNOLOGY CO., LTD., Yokohama (JP)

(72) Inventor: Michinobu Mizumura, Yokohama (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 411 days.

(21) Appl. No.: 18/021,356

(22) PCT Filed: Jun. 29, 2021

(86) PCT No.: PCT/JP2021/024560
§ 371 (c)(1),
(2) Date: Feb. 14, 2023

(87) PCT Pub. No.: WO2022/038904
PCT Pub. Date: Feb. 24, 2022

(65) Prior Publication Data
US 2023/0307205 A1  Sep. 28, 2023

(30) Foreign Application Priority Data

Aug. 19, 2020 (JP) .................. 2020-138718

(51) Int. Cl.
*H01J 37/18* (2006.01)
*H01J 37/30* (2006.01)
(52) U.S. Cl.
CPC .......... *H01J 37/18* (2013.01); *H01J 37/3007* (2013.01); *H01J 2237/1825* (2013.01); *H01J 2237/188* (2013.01); *H01J 2237/31749* (2013.01)
(58) Field of Classification Search
CPC ...... H01J 37/301; H01J 37/3007; H01J 37/18; H01J 2237/1825; H01J 2237/188;
(Continued)

(56) References Cited

U.S. PATENT DOCUMENTS 6,515,288 B1* 2/2003 Ryding ............... F16C 32/0603
250/462.1
7,806,983 B2* 10/2010 Chiang ............ C23C 16/45561
118/724

FOREIGN PATENT DOCUMENTS

| JP | 2000-6072 A | 1/2000 |
| JP | 2001-343021 A | 12/2001 |
| JP | 2019-179751 A | 10/2019 |

OTHER PUBLICATIONS

International Search Report (PCT/ISA/210) issued on Aug. 31, 2021, by the Japanese Patent Office as the International Searching Authority for International Application No. PCT/JP2021/024560. (5 pages).

(Continued)

*Primary Examiner* — David E Smith
*Assistant Examiner* — Hsien C Tsai
(74) *Attorney, Agent, or Firm* — LUCAS & MERCANTI, LLP (57) ABSTRACT

A focused ion beam system has a differentially-pumped vacuum unit and a focused ion beam column, comprising: a vacuum pad, of a porous material, with a suction surface exposed in a way that surrounds the outer edge of a substrate to be processed; a substrate support on which the substrate and vacuum pad are placed, and a vacuum pump for vacuum evacuation using the vacuum pad. The system provides an arrangement in which, while a head of the differentially-pumped vacuum unit partially falls out of the outer edge of the substrate, the suction surface allows an input of air evacuated from a region between the suction surface and the head, and the processing area on a substrate is expanded by allowing the processing with an ion beam to be performed even in the vicinity of the peripheral substrate surface without requiring a large vacuum chamber.

5 Claims, 11 Drawing Sheets

(58) Field of Classification Search
CPC ....... H01J 2237/31749; H01J 2237/162; H01J 2237/166; H01J 2237/1701; H01J 2237/2006
See application file for complete search history.

(56) References Cited

OTHER PUBLICATIONS

Written Opinion (PCT/ISA/237) issued on Aug. 31, 2021, by the Japanese Patent Office as the International Searching Authority for International Application No. PCT/JP2021/024560. (3 pages).
First Office Action, issued on Oct. 26, 2024 for the corresponding Chinese patent application No. 202180042279.8, with English machine translation thereof, 10 pages.

* cited by examiner

FOCUSED ION BEAM SYSTEM

CROSS-REFERENCE TO RELATED APPLICATION

This application is a 35 U.S.C. 371 National Phase Entry Application of International Patent Application PCT/JP2021/024560 filed Jun. 29, 2021, which claims priority to Japanese Patent Application No. 2020-138718 filed Aug. 19, 2020, the disclosures of which are incorporated herein in their entirety by reference, and priority is claimed to each of the foregoing.

FIELD OF THE INVENTION

The present invention relates to focused ion beam systems having a differentially-pumped vacuum unit.

BACKGROUND

In recent years, there is proposed a scanning electron microscope system with a localized differentially-pumped vacuum unit as installed at the tip of a beam irradiation unit (see, for example, Patent Literature 1). With the use of the differentially-pumped vacuum unit to locally create a vacuum region on the surface of a sample, it is no longer needed to install a large vacuum chamber for the system. In this known system, evenly distributed exhaust ports are cut through the bottom of a groove, which is formed between a retraction member, above which the beam irradiation unit takes a retracted position, and a sample support, on which a sample is placed. These exhaust ports are arranged for maintaining a vacuum right under the differentially-pumped vacuum unit when it crosses the groove during movement from its retracted position above the retraction member to a position above the sample placed on the support.

PRIOR ART

Patent Literature 1: JP 2019-179751 A

SUMMARY OF THE INVENTION

The above described scanning electron microscope system is, however, required to precisely set the height level of the upper surface of the retraction member to be flush with that of the sample. This is because a difference in height level between the upper surfaces of the retraction member and the sample will result in an increased gap between the reaction member or the sample, whichever is lower in level, and the bottom surface of the differentially-pumped vacuum unit which leads to a difficulty in keeping the vacuum region at a required degree of vacuum.

In view of the challenge arising in the prior art, the present invention aims at providing a focused ion beam system which expands the scope of the processing area on a substrate to be processed by allowing the processing with an ion beam to be performed even in the vicinity of the periphery of the surface on the substrate without requiring a large vacuum chamber.

In one aspect, there is provided a focused ion beam system including a differentially-pumped vacuum unit, and a focused ion beam column,
wherein the differentially-pumped vacuum unit has a head adapted to face a region within a surface to be processed of a substrate to be processed; exhaust grooves that are cut into the head from that surface which is adapted to face the surface to be processed and run in a way that surround the center of the head, and an orifice within a region that is radially inward of the exhaust grooves and forms a part of a processing vacuum region, which allows a processing to be performed in the region within the surface to be processed, with the result that the exhaust grooves provide an outlet of air evacuated from the processing vacuum region while, with the facing surface of the head facing the surface to be processed, vacuum evacuation works to create a high vacuum inside the processing vacuum region, and
wherein the focused ion beam column has a chamber placed near the surface of the head opposite to the facing surface of the head and connected to the orifice for communication with the processing vacuum region, and a focused ion beam optical system built in the chamber to emit a focused ion beam in a way that passes through the orifice,
characterized in that
the focused ion beam system comprises:
a vacuum pad, of a porous material, with a suction surface being exposed in a way that surrounds the outer edge of the substrate;
a substrate support on which the substrate and vacuum pad are placed, and a vacuum pump for vacuum evacuation using the vacuum pad, to provide an arrangement in which, while the head of the differentially-pumped vacuum unit partially falls out of the outer edge of the substrate, the suction surface allows an input of air evacuated from a region between the suction surface and the head to maintain the high vacuum inside the processing vacuum region.

Optionally, the vacuum pad is formed only in that region which surrounds the edge of the substrate, and the top of the vacuum pad and that surface of the vacuum pad which faces the outer edge of the substrate constitute the suction surface.

Optionally, the top of the vacuum pad faces the facing surface of the head while the head partially falls out of the outer edge of the substrate.

Optionally, the vacuum pad has a rectangular plate shape having a contour larger than that of the substrate, and is placed on the top of the substrate support, and the substrate and a support pad are placed on the vacuum pad, the support pad surrounding the outer edge of the substrate, but it is separated outward in the surface direction from the outer edge of the substrate with a predetermined gap.

Optionally, the support pad is made of a porous material.

As described, a focused ion beam system is realized which expands the processing area of a substrate to be processed by making the processing to be performed even in the vicinity of the periphery of the surface on the substrate.

DETAILED DESCRIPTION

Referring to the accompanying drawings, various embodiments are described below. The drawings schematically show focused ion beam systems, so each of the members constituting each of the systems is different from what is real in size, in dimensional ratio, in number of its parts, in configuration and the like. In addition, the drawings contain portions which are the same but different in size, dimensional ratio, and configuration.

First Embodiment: Schematic Configuration of Focused Ion Beam System

The focused ion beam systems find application in repairing a substrate, such as a photomask, a TFT substrate. The focused ion beam systems also find application in an electron-beam lithography system that allows you to draw a custom pattern on a substrate, a scanning electron microscope that enables you to observe the condition of the surface of a substrate by producing images of the surface by scanning the surface with a focused beam of electrons, and the like.

Figure 1:
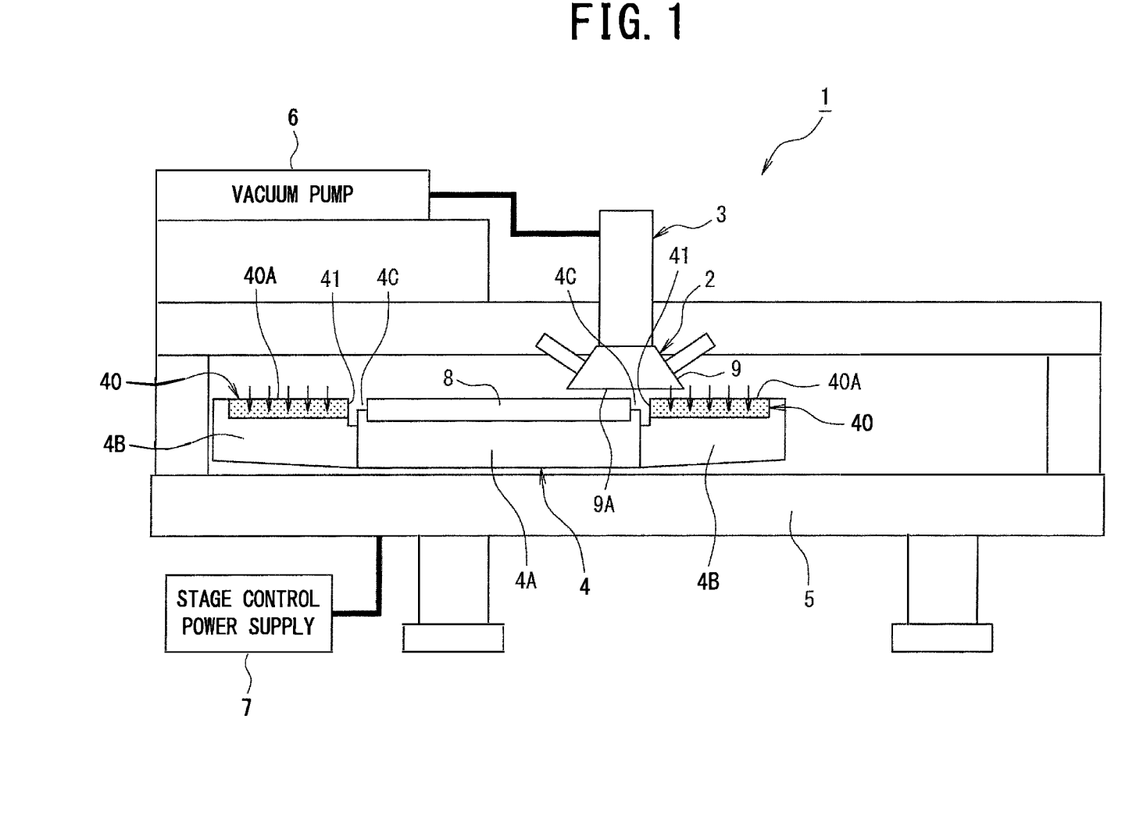
FIG. 1 is a schematic configuration diagram of a focused ion beam system according to a first embodiment of the present invention.

FIG. 1 is a schematic configuration diagram of a focused ion beam system 1 according to a first embodiment. The focused ion beam system 1 includes a differentially-pumped vacuum unit 2, a focused ion beam (FIB) column 3, a substrate support 4, and an XY stage 5 for XY motion of the substrate support 4.

To maintain a predetermined low pressure inside the FIB column 3, a vacuum pump 6 is connected to the FIB column 3. A stage control power supply 7 is connected to the XY stage 5.

Configuration of Substrate Support

The substrate support 4 includes a substrate support portion 4A and a peripheral support portion 4B. A substrate 8 to be processed is mounted to the substrate support portion 4A with its surface 8A to be processed up. The peripheral support portion 4B is shaped to extend along the outer edge of the substrate support portion 4A to surround it.

Arranged on the peripheral support portion 4B is a vacuum pad 40 in the form of a layer of a continuous open cell porous material. The vacuum pad 40 is shaped like a picture frame that surrounds the outer edge of the substrate 8 placed on the substrate support portion 4A but is separated from the outer edge the substrate 8 by an annular groove (or gap) 4C. The vacuum pad 40 has its bottom pumped downward by a vacuum pump (not shown). The vacuum pad 40 has its inner edge (i.e., the wall defining the inner edge) 41 exposed to the groove 4C as a suction surface. In other words, the inner edge 41 of the vacuum pad 40 defines the inner wall of the groove 4C. The vacuum pad 40 may be made of, for example, a ceramic sintered porous body, a heat-resistant metal fiber filter, or the like.

Figure 4:
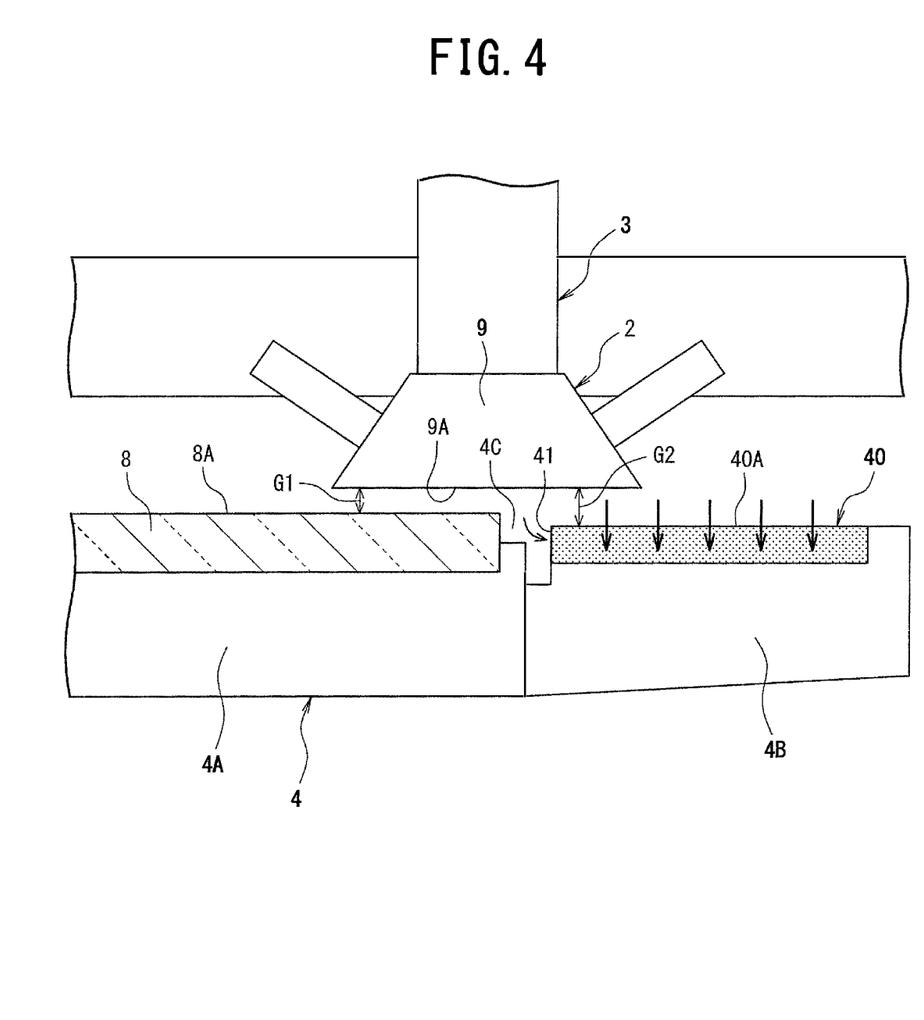
FIG. 4 is an illustration diagram of a sectional view of the differentially-pumped unit that is positioned above a portion of the periphery of a substrate to be processed, presenting an example in which the top of a vacuumed layer is at a height level lower than the top of the substrate to be processed.
Figure 5:
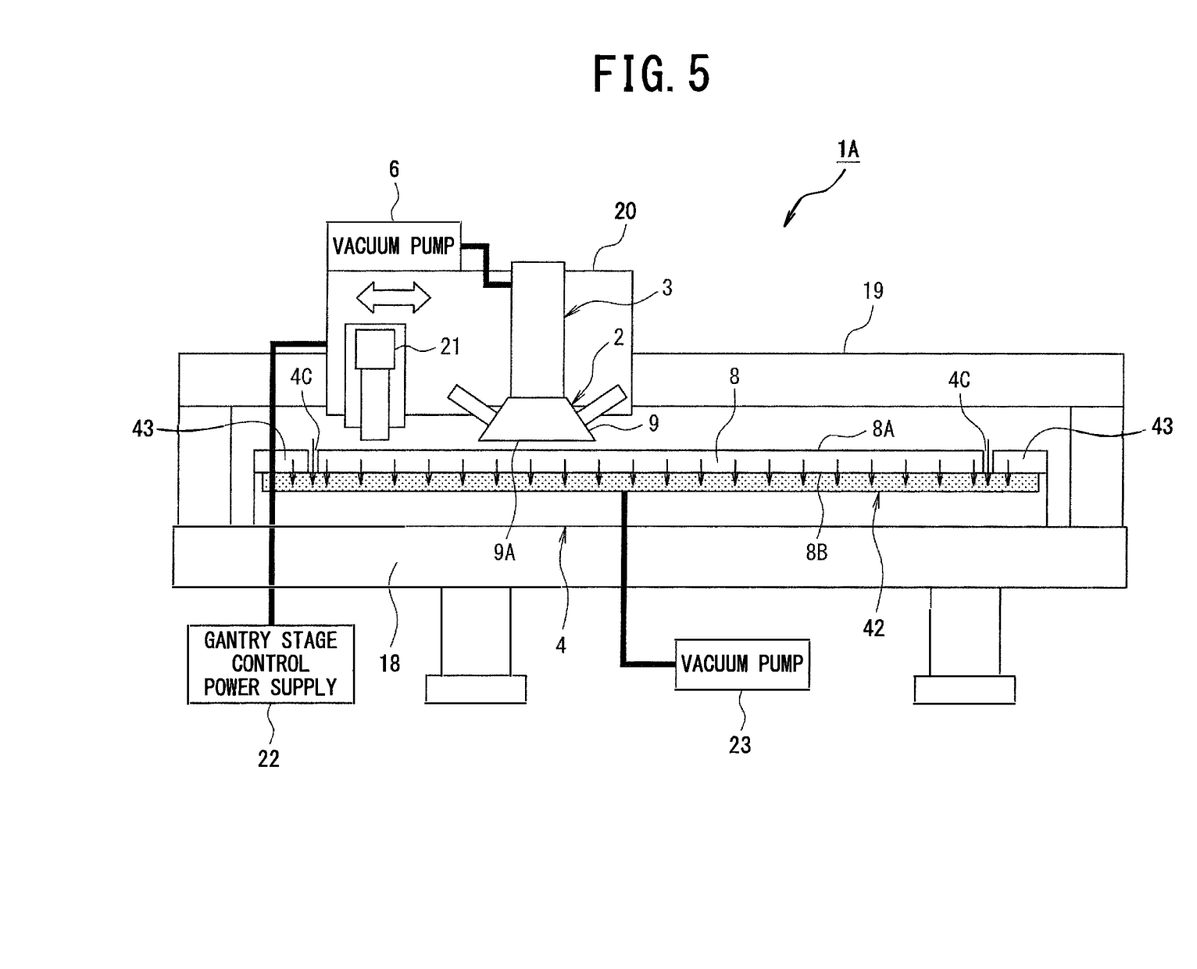
FIG. 5 is a schematic configuration diagram of a focused ion beam system according to a second embodiment of the present invention, with an optical alignment microscope being positioned above an alignment mark that is inside and in the neighborhood of the periphery of a substrate to be processed.

The focused ion beam system 1 does not require that the height level of the top 40A of the vacuum pad 40 be set to match the height level of the surface 8A to be processed of the substrate 8, which is placed on the substrate support portion 4A. In other words, the top 40A of the vacuum pad 40 may be lower, in height, than the surface 8A of the substrate 8 as shown in FIG. 4, or the former may be higher, in height, than the latter as shown in FIG. 5.

However, the setting of the height level of the top 40A of the vacuum pad 40 is such that the vacuum pad 40 will avoid contact with the head 9 while the head 9 is moving, with that surface (i.e., a facing surface at the bottom) 9A which is adapted to face the surface 8A being separated from the surface 8A by an appropriate gap G1, while the head 9 is partially falls out of the outer edge of the substrate 8.

Configuration of Differentially-Pumped Vacuum Unit

Figure 2:
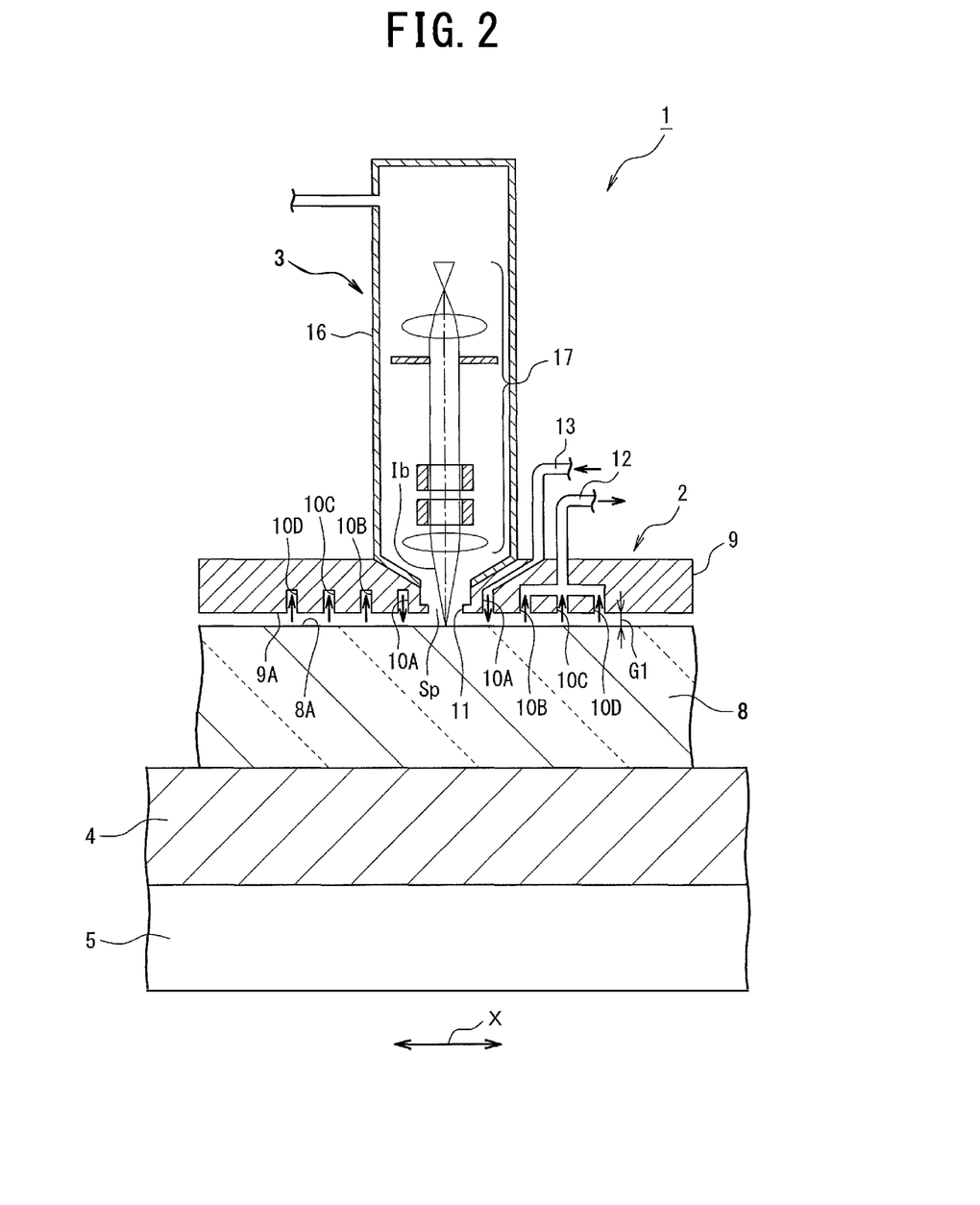
FIG. 2 is a sectional view of only major parts of the focused ion beam system according to the first embodiment of the present invention.
Figure 3:
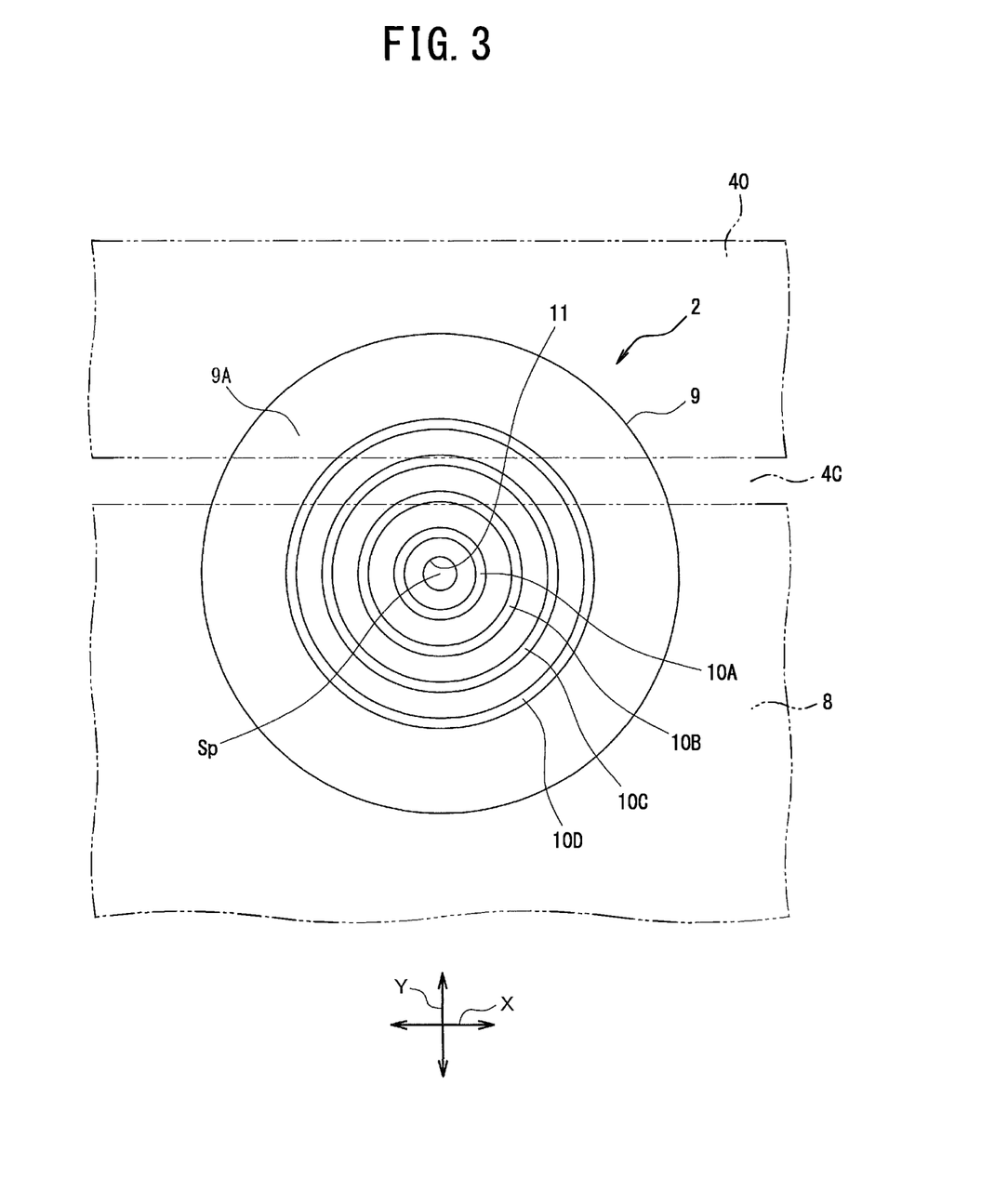
FIG. 3 is a bottom view of a differentially-pumped vacuum unit, as viewed from the bottom, of the focused ion beam system according to the first embodiment of the present invention.

With reference to FIG. 1 through FIG. 3, the configuration of the differentially-pumped vacuum unit 2 is described. FIG. 3 is a bottom view of the differentially-pumped vacuum unit 2. The differentially-pumped vacuum unit 2 includes the head 9 and a vacuum pump system (not shown).

The head 9 is in the form of a disc-shaped metal plate, which is exceedingly small in area than the surface 8A of the substrate 8. By XY motion of the substrate support 4 by means of the XY stage 5, the head 9 is moved to a point at which the head 9 faces an area within the surface 8A.

As shown in FIG. 3, the facing surface 9A of the head 9 is formed with four concentric closed-loop grooves 10A, 10B, 10C, and 10D. Within an area surrounded by the innermost closed-loop groove 10A among the closed-loop grooves 10A, 10B, 10C, and 10D, the head 9 is formed with an orifice 11 that forms a part of a processing vacuum region Sp. The processing vacuum region Sp allows the processing such as an ion-beam-induced deposition to be performed in an area on the surface 8A of the substrate 8.

A FIB column 3, which will be described later, is connected to the orifice 11. In the description, each of the grooves that surround the center of the head 9 is referred to as "a closed-loop groove," but the phrase "a closed-loop groove" is herein used to mean a circular loop-shaped groove, a square loop-shaped groove, a loop which is partially lost, such as, a C-shaped groove, grooves intermittently lined in a loop, and the like.

Among the closed-loop grooves 10A, 10B, 10C, and 10D, one or more (three in the present embodiment) closed-loop grooves 10A, 10B, and 10C are connected to the vacuum pump system (not shown) via a connecting pipe 12 (see FIG. 2) to serve as exhaust grooves. The innermost closed-loop groove 10A is connected via a connecting tube 13 (see FIG.

2) to a source gas supply, not shown, which is a supply source of a deposition gas (i.e., a gas for deposition, a gas for CVD).

With the facing surface 9A facing the surface 8A, evacuating air from the closed-loop grooves 10B, 10C, and 10D to maintain a low pressure inside the processing vacuum region Sp is a feature of the head 9. In addition, supplying, without fail, a gas for deposition to the processing vacuum region Sp from the innermost closed-loop groove 10A to ensure film growth with CVD on that area within the surface 8A which is exposed to the beam passing through the orifice 11 is another feature of the head 9.

With the surfaces 9A and 8A kept parallel, only separating the surfaces 9A and 8A from each other by a predetermined gap G1 is required to maintain a high vacuum inside the processing vacuum region Sp without leaking from the processing vacuum region Sp.

Focused Ion Beam Column: FIB Column

With its tip being set as being embedded in the head 9 above the orifice 11, the FIB column 3 is coupled to the head 9 from the side (i.e., the upper side) of the head 9 opposite to the facing surface 9A.

The FIB column 3 includes a cylindrical chamber 16 communicating with the processing vacuum region Sp, and a focused ion beam optical system 17 built in the chamber 16. The FIB column 3 emits an ion beam Ib from its tip in a direction passing through the orifice 11 toward the surface 8A of the substrate 8.

Operation & Action

The focused ion beam system 1 according to the embodiment is described below with respect to operation and action. The focused ion beam system 1 irradiates any position as desired with an ion beam 1b after moving the focused ion beam column 3 with the differentially-pumped vacuum unit 2 relative to the substrate 8 to the desired position.

In the present embodiment, the predetermined gap G1, by which the surfaces 9A and 8A are separated from each other, is such as 30 μm to maintain a high vacuum inside the processing vacuum region Sp without interruption caused due to rupture of the high vacuum.

By XY motion of the substrate support table 4 with the XY stage 5, the head 9 is moved to a point at which the head 9 faces an optional area within the surface 8A.

Because the vacuum pad 40 is arranged, the focused ion beam system 1 maintains a high vacuum inside the processing vacuum region Sp even though the differentially-pumped vacuum unit partially falls out of the outer edge of the substrate 8. If, as shown in FIG. 4, the top 40A of the vacuum pad 40 is lower than the outer edge of the surface 8A of the substrate 8, the top 40A of the vacuum pad 40 is separated from the facing surface 9A of the differentially-pumped vacuum unit 2 by a gap G2 larger than the predetermined gap G1. In this case, the focused ion beam system 1 maintains a high vacuum inside the processing vacuum region Sp because air is evacuated from the region below that portion of the facing surface 9A of the head 9 which falls out of the outer edge of the substrate 8 through the vacuum pad 40.

Even under such circumstances while the facing surface 9A of the head 9 partially falls out of the outer edge of the substrate 8, as shown in FIG. 3, the focused ion beam system 1 maintains a vacuum inside the processing vacuum region Sp to allow any appropriate processing using an ion beam Ib to be performed without interruption.

In the illustrated structure in FIG. 4, the vacuum pad 40 includes an inner edge which is exposed to the inner edge of the annular groove 4C and provide a suction surface to perform an inlet of air evacuated. This prevents the pressure in the region above the groove 4C from rising because the inner edge 41 of the vacuum pad 40 provides an inlet of air evacuated from the radially inner region of the groove 4C and air evacuated from the region above the groove 4C.

Technical Effect of Focused Ion Beam System According to First Embodiment

As described in the description about operation & action, the focused ion beam system 1 according to the present embodiment does not require a large vacuum chamber, and ensures a reliable processing with an ion beam Ib of any areas near the outer edge of the substrate 8. This leads to a technical effect of expanding the area within which the processing is performed without fail.

In addition, according to the present embodiment, no need for strict height level control of the top of the vacuum pad 40 is an advantage because, as described, the vacuum pad 40 maintains a vacuum inside the region to which the differentially-pumped vacuum unit 2 that partially falls out of the outer edge of the substrate 8 is exposed.

Second Embodiment

Figure 6:
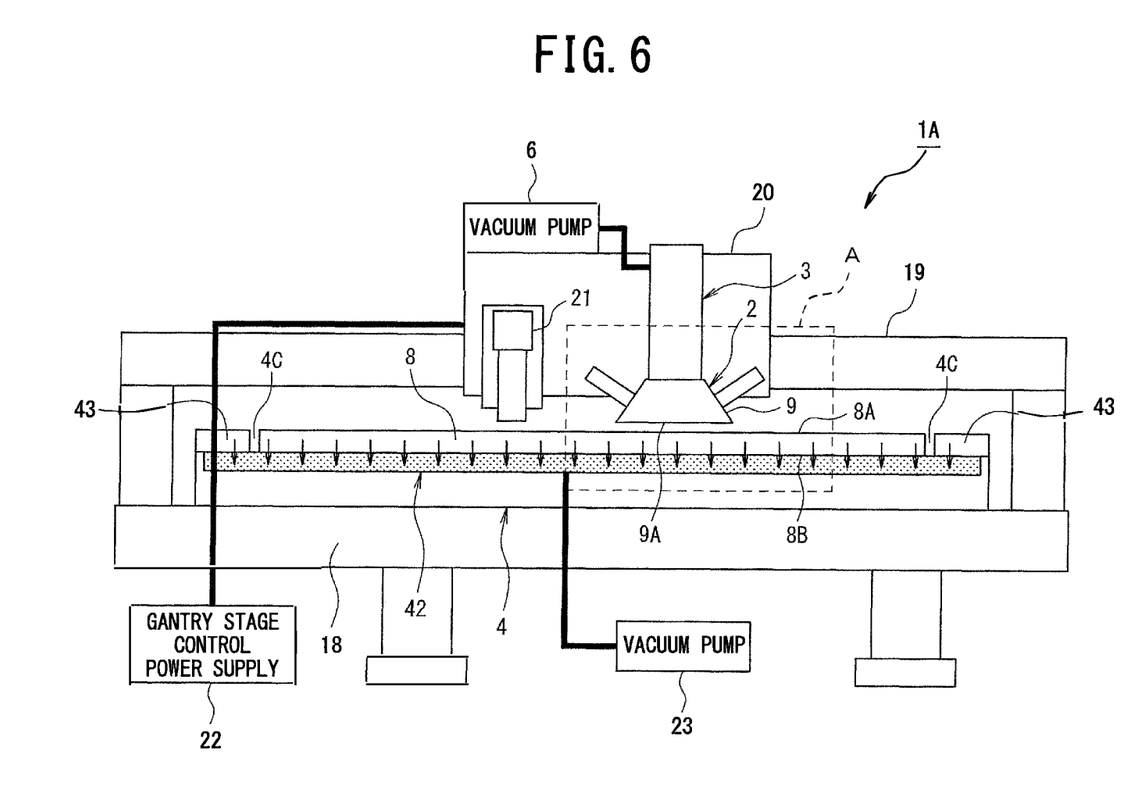
FIG. 6 is a schematic configuration diagram of the focused ion beam system according to the second embodiment of the present invention, with the differentially-pumped unit being positioned above the center portion of the substrate to be processed.

FIG. 6 shows a schematic configuration of a focused ion beam system 1A. This focused ion beam system 1A includes a differentially-pumped vacuum unit 2, an FIB column 3, a substrate support 4, a vacuum pad 42 placed on the top of the substrate support 4, a fixed stage 18 on which the substrate support 4 is mounted, and an XY gantry stage 19 installed on the fixed stage 18.

The XY gantry stage 19 has an XY motion block 20. The XY motion block 20 has fixed thereto a FIB column 3, a vacuum pump 6 connected to the FIB column 3, and an optical alignment microscope 21 for detecting alignment marks on the substrate 8. The XY gantry stage 19 is coupled to a gantry stage control power supply 22.

The vacuum pad 42 extends to cover all of the top of the substrate support 4 but lies within the outer edge of the substrate support 4. The size of the vacuum pad 42 is bigger than the size of the substrate 8. With the substrate 8 being placed on the center area within the outer edge of the vacuum pad 42, the vacuum pad 42 has on its top a support pad 43 that runs around all of the outer edge of the substrate 8. The support pad 43 is made of an impermeable material that does not allow air to pass through it.

The vacuum pad 42, which is made of a continuous open-cell porous material, is connected to a vacuum pump 23. The vacuum pump 23 is set to suck air from the top of the vacuum pad 42. The support pad 34 is separated from the substrate 8 by a gap to define a groove 4C running between the inner peripheral wall of the support pad 34 and the outer edge of the substrate 8. The groove 4C has a bottom serving as a suction surface where the top of the vacuum pad 42 is exposed.

Figure 9:
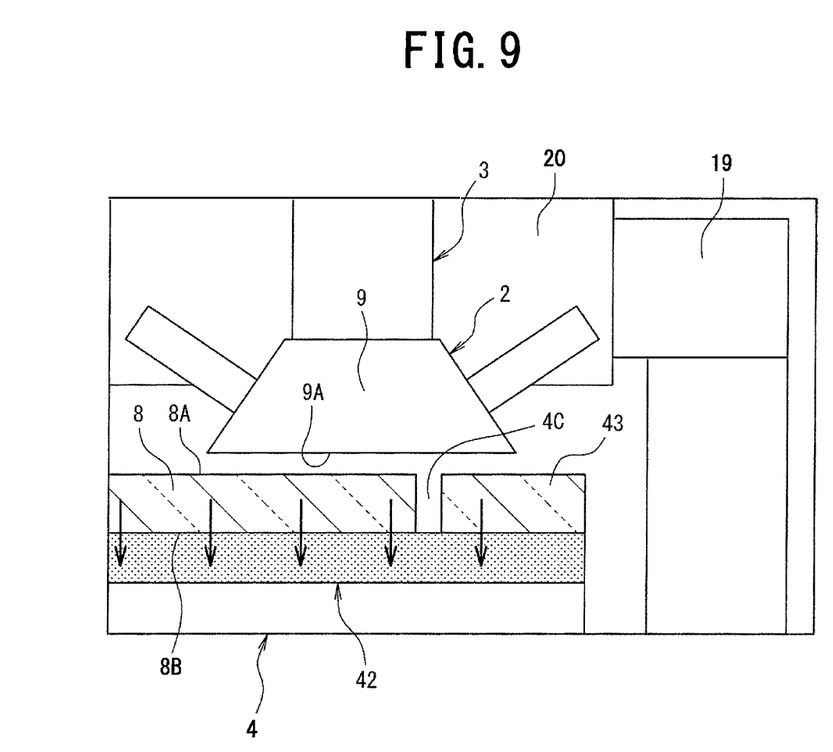
FIG. 9 is an enlarged illustration diagram of the rectangular area B surrounded by a dashed line in FIG. 7.

The vacuum pad 42 is made of, for example, a ceramic sintered porous body, a heat-resistant metal fiber filter, or the like. As shown in FIG. 9, in this embodiment, the support pad 43 is made of the same glass material as the substrate 8, and it is a glass plate having the same thickness as the substrate 8.

In addition, in the present embodiment, the support pad 43 is a glass plate, but the support pad 43 is not limited to a glass plate. The support pad 43 may be a metal plate, a ceramic plate, or the like.

The other portion of the configuration of the focused ion beam system 1A according to this embodiment is the same as that of the focused ion beam system 1 according to the first embodiment described before, so the detailed description is omitted.

In the focused ion beam system 1A according to this embodiment, the vacuum pad 42 lies as an underlayer of all of the area where the substrate 8 and support pad 43 are placed, so it draws, by suction, the substrate 8 and support pad 43.

If, as shown in FIG. 6, the head 9 of the differentially-pumped vacuum unit 2 is above the center of the substrate 8, the substrate 8 tends to warp upward as it is sucked by the head 9 because of a force causing the substrate 8 to warp upward. However, this force causing the substrate 8 to warp upward is offset because the substrate 8 is drawn downward by the vacuum pad 42.

Figure 8:
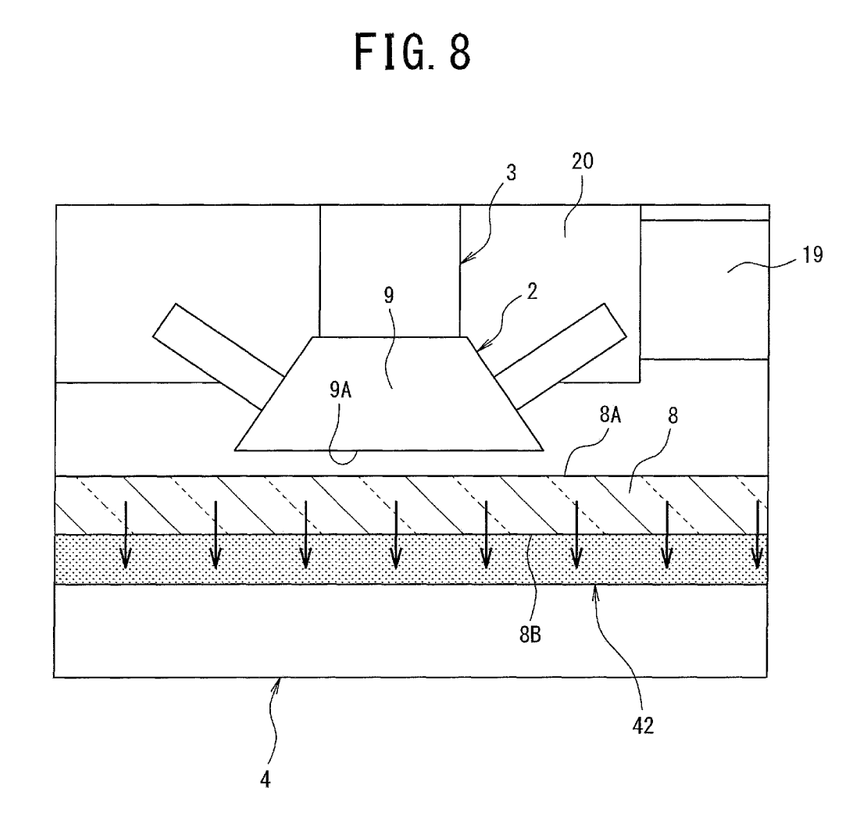
FIG. 8 is an enlarged illustration diagram of the rectangular area A surrounded by a dashed line in FIG. 6.
Figure 11:
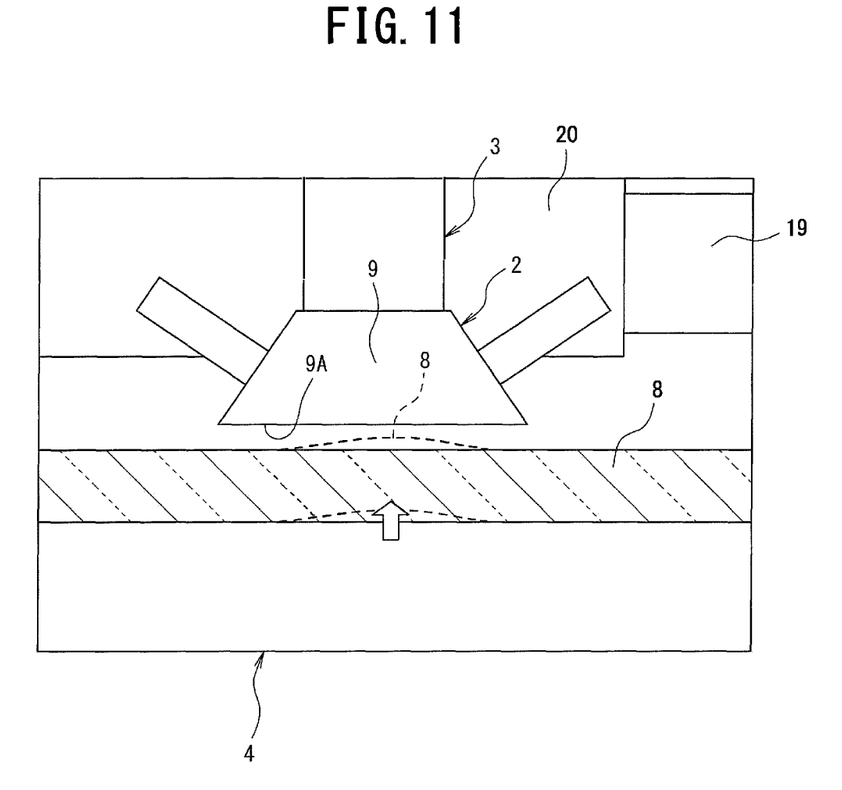
FIG. 11 is an enlarged illustration diagram of a portion of the focused ion beam system according to the second embodiment with a vacuumed layer being removed to give a comparative example.

FIG. 8 is an enlarged illustration diagram of an area A surrounded by a dashed line in FIG. 6. FIG. 11 is an enlarged illustration diagram of the configuration (comparative example) without a vacuum pad 42, showing a substrate 8 warping as being lifted because of suction from a head 9 if the vacuum pad 42 does not lie as an underlayer of the substrate 8.

In addition, substrates, grown in size and reduced in thickness, become an obstacle to processing with an ion beam by maintaining a localized vacuum with a differentially-pumped vacuum unit. The focused ion beam system 1A according to this embodiment ensures reliable mount of even a substrate, which is grown in size and reduced in thickness, to the substrate support 4 with the substrate being maintained flat. For this reason, this embodiment provides highly accurate processing even with the XY gantry stage 19 for XY motion.

Figure 7:
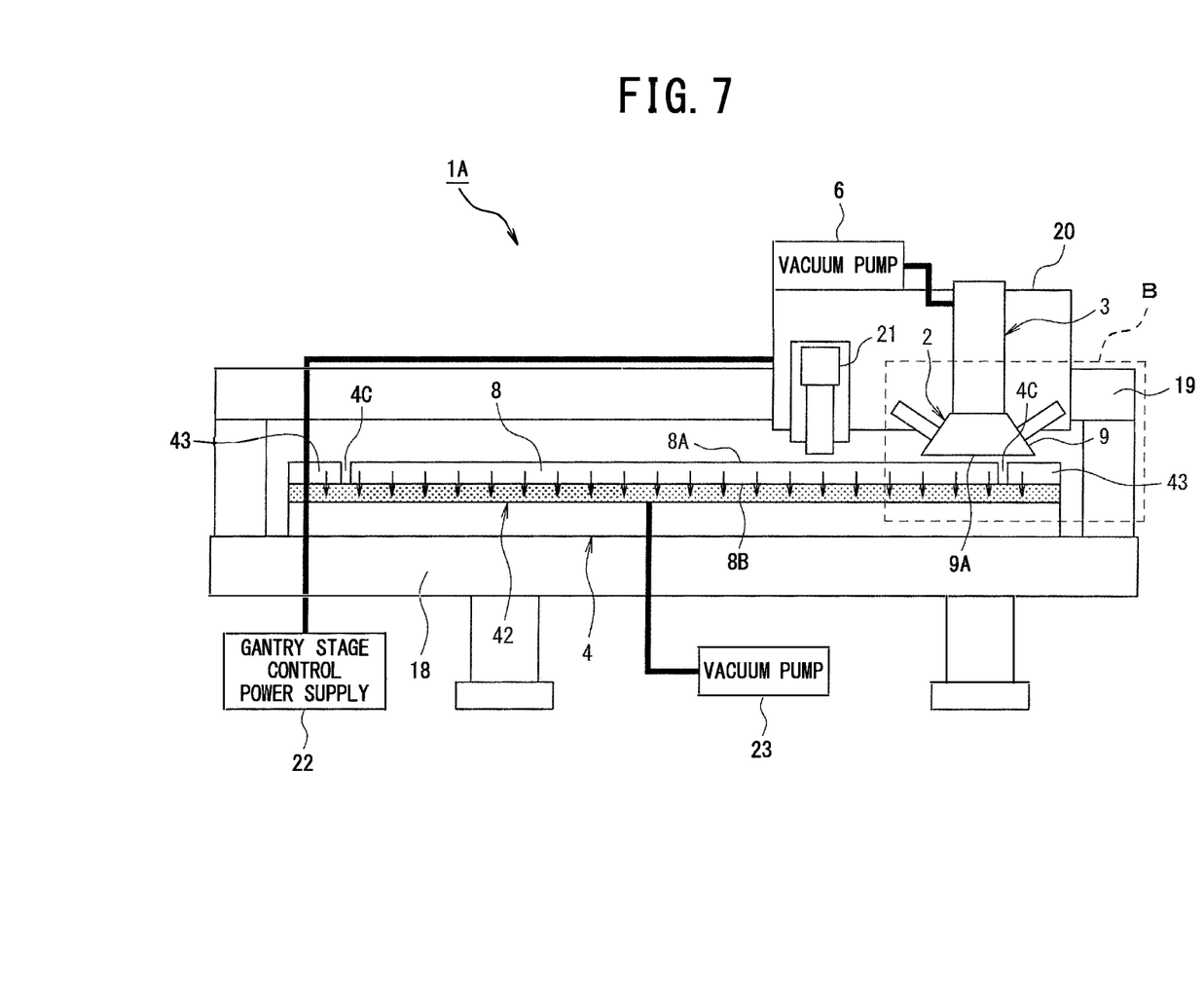
FIG. 7 is a schematic configuration diagram of the focused ion beam system according to the second embodiment of the present invention, with the differentially-pumped unit pumping system is positioned above the periphery of the surface on the substrate to be processed.

In the focused ion beam apparatus 1A, the groove 4C, which is defined by the gap, so exposes the top of the vacuum pad 42 at its bottom that this area also serves as an exit for air leaving the groove 4C toward the vacuum pad 42. As shown in FIGS. 7 and 9, this prevents deterioration in the pressure above the groove 4C because air is sucked not only from the space inside the groove 4C but also from the space above the groove 4C.

In addition, the top of the vacuum pad 42 passes completely around the substrate 8 and is exposed at each location of the bottom of the groove 4C which passes completely around the substrate 8, so the pressures applied to any given locations of the groove 4C are uniformized.

According to this embodiment, allowing optional setting of the width of the groove 4C, i.e., the width of the gap, followed by adjustment of the output of the vacuum pump 23 is an advantage.

The focused ion beam system 1A allows a processing using an ion beam Ib to be even performed in the vicinity of the outer edge of the substrate 8 without requiring a large vacuum chamber. Effectively processing a wide range of the substrate 8 is a technical effect of the focused ion beam system 1A.

In addition, the focused ion beam apparatus 1A makes it easy to install an optical alignment microscope 21 because the differentially-pumped vacuum unit 2 realizes a localized vacuum space only at the area being processed, leaving the other area under atmospheric pressure.

For beam alignment, the optical alignment microscope 21 is put at, for example, a position as shown in FIG. 5 to search for alignment marks, not shown, on the substrate 8 near the periphery. A set of coordinates is determined using the fixed relationship between the position at which the optical alignment microscope 21 is put and the position to be processed with a focused ion beam issued by the FIB column 3 and data obtained after searching for alignment marks.

For the above reason, the focused ion beam system 1A no longer requires the stroke needed for alignment by the XY gantry stage 19, and reduces movement time required for alignment.

In particular, with the position of the substrate 8 fixed, the FIB column and optical alignment microscope 30, which are fixed to the XY motion block 20, are movable because the XY motion block 20 is movably installed in the XY gantry stage 19. Fixing the position of the substrate 8 makes the footprint of the system smaller.

Moreover, the focused ion beam system 1A maintains a high vacuum inside the processing vacuum region Sp of the head 9 without fail, thus improving the quality of treatment under this processing vacuum region.

Furthermore, the focused ion beam system 1A is downsized, leading to equipment cost reduction and management cost reduction.

Other Embodiments

Although the embodiments of the present invention have been described, it should not be understood that the statements and drawings forming part of the disclosure of the embodiments limit the present invention. Various alternative embodiments, examples and operational techniques will become apparent to those skilled in the art from this disclosure.

Figure 10:
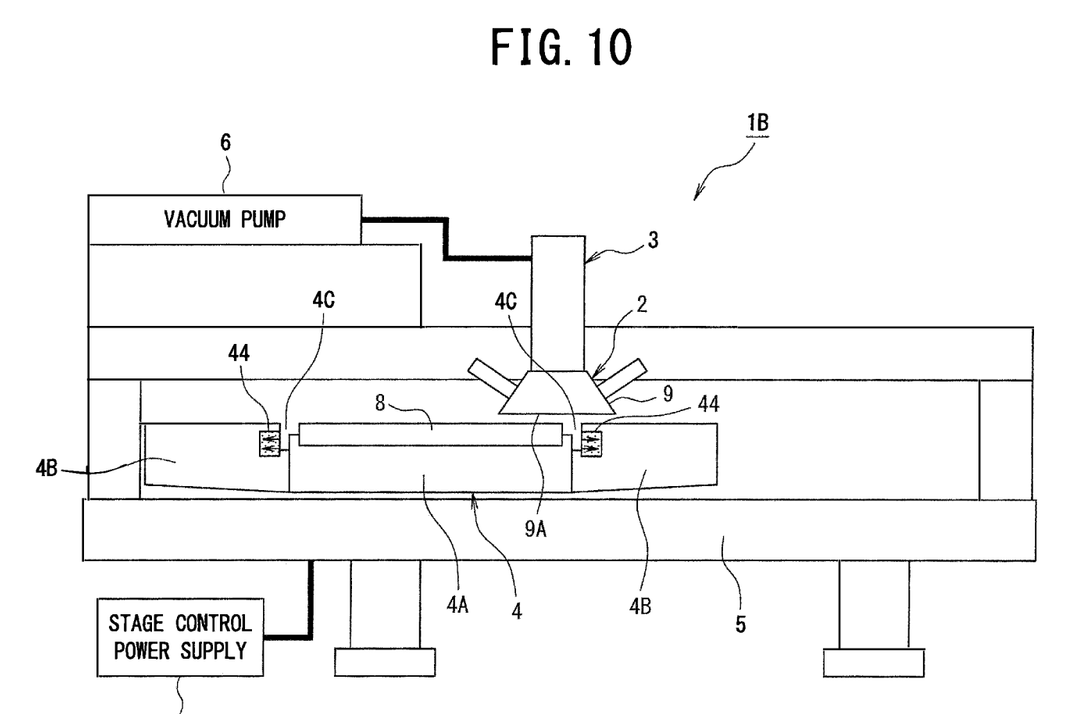
FIG. 10 is a schematic configuration diagram of a focused ion beam system according to other embodiment of the present invention.

In the before-described first embodiment, the vacuum pad 40 is placed on the top of the peripheral support portion 4B with the whole area of its top exposed, but a vacuum pad in the form of a wall 44 exposed to only the inside of the groove 4C may be arranged along the groove 4C in a way that completely surrounds the substrate 8.

That surface of the vacuum wall 44 which is exposed only to the groove 4C constitutes a suction surface, which is one of the essential elements of the present invention. In this case, the height level of the top of the peripheral support portion 4B is set to match the height level of the surface 8A of the substrate 8.

In each of the foregoing embodiments, the number of annular grooves formed in the differentially-pumped vacuum unit is not limited to four, and providing at least two grooves, one for exhausting and the other for blowing out suffice. In addition, the closed-loop grooves 10A, 10B, 10C, and 10D, which are annular grooves, are used as supply grooves and exhaust grooves, but they are not limited to these, and for example, rectangular closed-loop grooves may be used.

In the second embodiment, the support pad 43 is made of a non-permeable material through which air cannot pass, but it may be made of a porous material. In this case, the support pad 43 has the same function as the vacuum pad 40 in the first embodiment, so increasing the degree of freedom of the height level of the top of the support pad 43 is one technical effect, and preventing the occurrence of warping of the substrate 8 is another technical effect.

REFERENCE SIGNS

Ib Ion Beam
Sp Processing vacuum region
1 Focused Ion Beam System
2 Differentially-pumped Vacuum Unit
3 Focused Ion Beam (FIB) Column
4 Substrate Support 4A Substrate Support Portion
4B Peripheral Support Portion
4C Groove (Gap)
5 XY Stage
6 Vacuum Pump
7 Stage Control Power Supply
8 Substrate to be Processed
8A Surface to be Processed
8B Bottom
9 Head
9A Surface Facing Surface to be Processed
10A, 10B, 10C, 10D Closed-loop Groove
11 Orifice
12, 13 Connecting Pipe
16 Chamber
17 Focused Ion Beam Optical System
18 Fixed Stage
19 XY Gantry Stage
20 XY Motion Block
21 Optical Alignment Microscope
22 Gantry Stage Control Power Supply
23 Vacuum Pump
40 Vacuum Pad
40A Top (Suction Surface)
41 Edge (Surface Facing the Outer Edge of Substrate to be Processed: Suction Surface)
42 Vacuum Pad
43 Support Pad
44 Vacuum Wall

What is claimed is:

1. A focused ion beam system including a differentially-pumped vacuum unit, and a focused ion beam column,
wherein the differentially-pumped vacuum unit has a head adapted to face a region within a surface to be processed of a substrate to be processed; exhaust grooves that are cut into the head from that surface which is adapted to face the surface to be processed and run in a way that surround the center of the head, and an orifice within a region that is radially inward of the exhaust grooves and forms a part of a processing vacuum region, which allows a processing to be performed in the region within the surface to be processed, with the result that the exhaust grooves provide an outlet of air evacuated from the processing vacuum region while, with the facing surface of the head facing the surface to be processed, vacuum evacuation works to create a high vacuum inside the processing vacuum region, and
wherein the focused ion beam column has a chamber placed near the surface of the head opposite to the facing surface of the head and connected to the orifice for communication with the processing vacuum region, and a focused ion beam optical system built in the chamber to emit a focused ion beam in a way that passes through the orifice,
wherein the focused ion beam system comprises:
a vacuum pad, of a porous material, with a suction surface being exposed in a way that surrounds the outer edge of the substrate;
a substrate support on which the substrate and vacuum pad are placed, and
a vacuum pump for vacuum evacuation using the vacuum pad, to provide an arrangement in which, while the head of the differentially-pumped vacuum unit partially falls out of the outer edge of the substrate, the suction surface allows an input of air evacuated from a region between the suction surface and the head to maintain the high vacuum inside the processing vacuum region.

2. The focused ion beam system according to claim 1, wherein the vacuum pad is formed only in that region which surrounds the edge of the substrate, and the top of the vacuum pad and that surface of the vacuum pad which faces the outer edge of the substrate constitute the suction surface.

3. He focused ion beam system according to claim 2, wherein the top of the vacuum pad faces the facing surface of the head while the head partially falls out of the outer edge of the substrate.

4. The focused ion beam system according to claim 1, wherein
the vacuum pad has a rectangular plate shape having a contour larger than that of the substrate, and is placed on the top of the substrate support, and
the substrate and a support pad are placed on the vacuum pad, the support pad surrounding the outer edge of the substrate, but it is separated outward in the surface direction from the outer edge of the substrate with a predetermined gap.

5. The focused ion beam system according to claim 4, wherein the support pad is made of a porous material.

* * * * *